US009581668B2

(12) United States Patent
Waddell

(10) Patent No.: US 9,581,668 B2
(45) Date of Patent: Feb. 28, 2017

(54) MULTIPLE RESONANCE NMR SPECTROSCOPY USING A SINGLE TRANSMITTER

(75) Inventor: Kevin W. Waddell, Hendersonville, TN (US)

(73) Assignee: Vanderbilt University, Nashville, TN (US)

( * ) Notice: Subject to any disclaimer, the term of this patent is extended or adjusted under 35 U.S.C. 154(b) by 620 days.

(21) Appl. No.: 14/125,418

(22) PCT Filed: Jul. 8, 2011

(86) PCT No.: PCT/US2011/043425
§ 371 (c)(1),
(2), (4) Date: Dec. 11, 2013

(87) PCT Pub. No.: WO2012/173635
PCT Pub. Date: Dec. 20, 2012

(65) Prior Publication Data
US 2014/0132265 A1  May 15, 2014

Related U.S. Application Data

(60) Provisional application No. 61/496,552, filed on Jun. 13, 2011.

(51) Int. Cl.
*G01R 33/54* (2006.01)
*G01R 33/36* (2006.01)
*G01R 33/46* (2006.01)

(52) U.S. Cl.
CPC ......... *G01R 33/543* (2013.01); *G01R 33/3635* (2013.01); *G01R 33/46* (2013.01)

(58) Field of Classification Search
CPC .... G01R 33/543; G01R 33/3635; G01R 33/46
See application file for complete search history.

(56) References Cited

U.S. PATENT DOCUMENTS 4,983,921 A * 1/1991 Kramer ................ G01R 33/583
324/309
5,436,600 A 7/1995 Van Heteren et al.
(Continued)

OTHER PUBLICATIONS

Adams RW, Aguilar JA, Atkinson KD, Cowley MJ, Elliott PI, Duckett SB, Green GG, Khazal IG, Lopez-Serrano J, Williamson DC, "Reversible interactions with para-hydrogen enhance NMR sensitivity by polarization transfer", Science 2009;323(5922):1708-1711.

(Continued)

*Primary Examiner* — Rodney Bonnette
(74) *Attorney, Agent, or Firm* — Michael Best & Friedrich LLP

(57) ABSTRACT

An NMR imaging system comprising a transceiver module configured to couple with a magnetic resonance transmitter coil, where the transceiver module includes a first transmitter channel and a pulse programmer configured to control the transceiver module, the transceiver module generating a precession and nutation for observing rotation at multiple intervals about the carrier ("PANORAMIC") waveform, the PANORAMIC waveform configured to produce nuclear polarization. The PANORAMIC waveform may a single-banded PANORAMIC waveform or a multiple-banded PANORAMIC waveform. A method of NMR spectroscopy or imaging, the method comprising: determining for a nuclear spin rotation at least one frequency interval and at least one corresponding phase; creating a PANORAMIC waveform for the at least one frequency interval and the at least one corresponding phase; and applying the PANORAMIC waveform from an amplifier output to a probe input. The PANORAMIC waveform may be a single-banded PANORAMIC waveform or a multiple-banded PANORAMIC waveform.

18 Claims, 5 Drawing Sheets

(56) References Cited

U.S. PATENT DOCUMENTS

| | | |
|---|---|---|
| 6,624,630 B1 | 9/2003 | Foxall |
| 7,081,753 B2 | 7/2006 | Mullen et al. |
| 7,355,400 B2 | 4/2008 | Mikhaltsevitch et al. |
| 7,633,293 B2 | 12/2009 | Olson et al. |
| 2010/0171499 A1 | 7/2010 | Sharp et al. |
| 2010/0308820 A1* | 12/2010 | Blank .................. G01N 24/08 324/309 |
| 2010/0329527 A1 | 12/2010 | Iannotti et al. |

OTHER PUBLICATIONS

Bendall MR, Pegg DT, "Theoretical description of depth pulse sequences, on and off resonance, including improvements and extensions thereof", Magn Reson Med 1985;2(2):91-113.

Bowers CR, Weitekamp DP, "Transformation of symmetrization order to nuclear-spin magnetization by chemical reaction and nuclear magnetic resonance" Phys Rev Lett 1986:57(21):2645-2648.

Goldman et al., "Conversion of a proton pair para order into 13C polarization by rf irradiation, for use in MRI", Physique 6, 2005, 575-581.

Golman K, Zandt RI, Lerche M, Pehrson R, Ardenkjaer-Larsen JH, "Metabolic imaging by hyperpolarized 13C magnetic resonance imaging for in vivo tumor diagnosis", Cancer Res 2006;66(22):10855-10860.

International Search Report and Written Opinion for Application No. PCT/US2011/043425 dated Nov. 1, 2011 (16 pages).

Skinner TE, Reiss TO, Luy B, Khaneja N, Glaser SJ, "Application of optimal control theory to the design of broadband excitation pulses for high-resolution NMR", J Magn Reson 2003;163(1):8-15.

Skinner TE, Reiss TO, Luy B, Khaneja N, Glaser SJ, "Reducing the duration of broadband excitation pulses using optimal control with limited RF amplitude", J Magn Reson 2004:167(1):68-74.

* cited by examiner

MULTIPLE RESONANCE NMR SPECTROSCOPY USING A SINGLE TRANSMITTER

CROSS-REFERENCE TO RELATED APPLICATIONS

This patent application is a national stage filing under 35 U.S.C. 371 of International Application No. PCT/US2011/043425, filed on Jul. 8, 2011, which claims priority to U.S. Provisional Patent Application No. 61/496,552, filed Jun. 13, 2011, the disclosures of which are incorporated by reference herein in their entireties. Priority to each application is hereby claimed.

GOVERNMENT LICENSE RIGHTS

This invention was made with government support from a National Institutes of Health and National Cancer Institutes grant 5P50 CA128323-02. The government has certain rights in the invention.

INTRODUCTION

Processes for quick and routine detection of metabolism in vivo are developing in parallel with advances in technology for polarizing magnetic moments, i.e., hyperpolarization methods. These hyperpolarization methods have enabled the measurement of metabolism at temporal resolutions on a time scale of seconds. When infused into organisms harboring tumor cells, molecules, such as pyruvate and lactate, have been shown to be sufficiently long-lived to penetrate cellular metabolic cycles and show differential conversion in cancer compared to normal tissue. Among available methods for hyperpolarizing precursors, dynamic nuclear polarization has been most frequently used in early studies of fast metabolism, due to commercial availability and the flexibility to polarize small molecules. Lower-cost techniques based on chemical addition (e.g., PASADENA)) or exchange (e.g., SABRE) of parahydrogen have the potential to generate similar or higher levels of enhancement at lower cost and, therefore, could emerge as leading diagnostic tools in studies of metabolism, particularly as sensors for oxidative metabolism where the conditions for synthesizing suitable unsaturated precursors are less demanding.

SUMMARY

The disclosure provides, among other things, an NMR imaging system comprising a transceiver module configured to couple with a magnetic resonance transmitter coil, wherein the transceiver module includes a first transmitter channel; and a pulse programmer configured to control the transceiver module, the transceiver module generating a PANORAMIC waveform, the PANORAMIC waveform configured to produce nuclear polarization. In some embodiments, the transmitter channel is a phase and amplitude-modulated transmitter channel. In some embodiments, the PANORAMIC waveform is a single-banded PANORAMIC waveform. In some embodiments, the PANORAMIC waveform is a multiple-banded PANORAMIC waveform. In some embodiments, the PANORAMIC waveform is applied from a single amplifier output to a single probe input. In some embodiments, the magnetic resonance transmitter coil is a double-tuned proton/carbon-13 coil. In some embodiments, the magnetic resonance transmitter coil is configured to accept multiple frequency inputs and produce more than two resonant responses and wherein the PANORAMIC waveform multiplexes at least one of the resonant responses. In some embodiments, the transceiver module further includes a second transmitter channel.

The disclosure additionally provides, among other things, a method of NMR spectroscopy or imaging, the method comprising: determining for a nuclear spin rotation at least one frequency interval and at least one corresponding phase; creating a PANORAMIC waveform for the at least one frequency interval and the at least one corresponding phase; and applying the PANORAMIC waveform from an amplifier output to a probe input. In some embodiments, the PANORAMIC waveform is a single-banded PANORAMIC waveform. In some embodiments, the PANORAMIC waveform is a multiple-banded PANORAMIC waveform. In some embodiments, the method further comprises the step of making adjustments to inter-pulse spacings to match the frequency bands to multinuclear frequencies. In some embodiments, the method further comprises the step of scaling the amplitudes of the PANORAMIC waveforms. In some embodiments, the method further comprises the step of interleaving the PANORAMIC waveforms. In some embodiments, the NMR imaging takes place using a static magnetic field of about 10 mT to about 15 mT.

DETAILED DESCRIPTION

Figure 1:
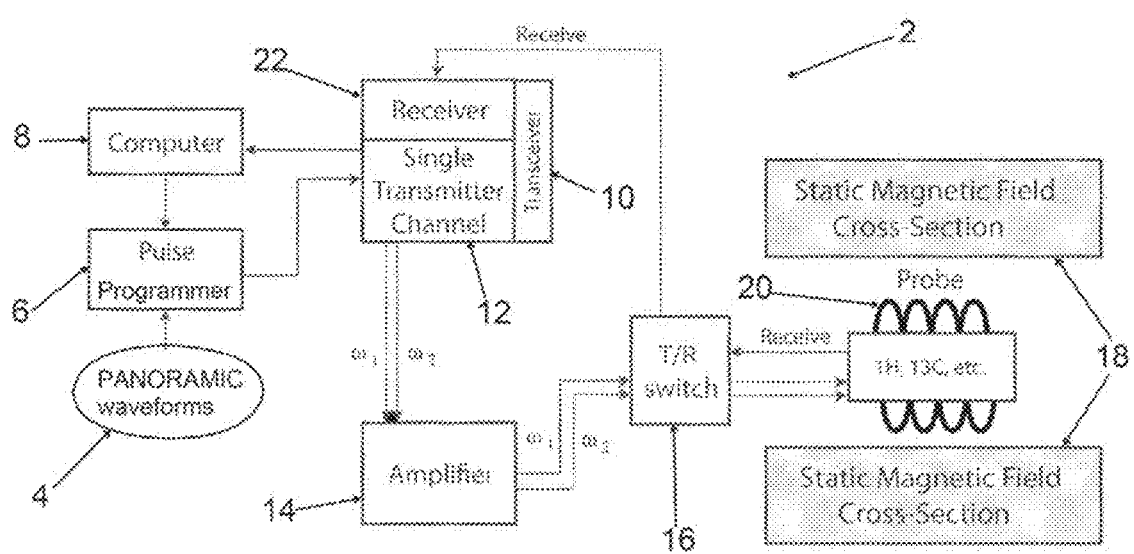
FIG. 1 is a schematic representation of a system for performing multinuclear, multiple resonant magnetic resonance spectroscopy with a single channel using precession and nutation for observing rotation at multiple intervals about the carrier ("PANORAMIC") waveforms.

Embodiments of the present disclosure relate to systems and methods for enabling polarization transfer between nuclei in low-field magnetic resonance procedures using a single radiofrequency transmitter.

In methods of sensitivity enhancement based on the chemical addition of parahydrogen, polarization is obtained on protons, where it is relatively short-lived, and additional techniques may be necessary for transferring magnetization to reservoirs with more favorable relaxation properties. These multinuclear polarization transfers depend specifically on the network of spin-couplings in the molecule being studied, but the application of magnetic fields at multinuclear resonance frequencies is generally required. However, applying phase-coherent pulses on distinct channels requires adding bulk and complexity to the nuclear magnetic resonance ("NMR") instrumentation and, in contrast to high-resolution NMR, this multinuclear capability is not widespread commercially. Moreover, adding phase-coherent transmitters ad hoc would likely be a considerable distraction for most research labs, and particularly for those equipped with commercial NMR instruments.

The process of polarization transfer requires responses which are phase-shifted in the frequency domain with respect to one another. To accomplish this magnetization transfer from a single transmitter, phase and amplitude modulated waveforms may be designed that are capable of generating arbitrary, frequency-domain, phase relationships at the frequencies of the heteronuclear pair, where transfer will occur. For example, when exposed to a magnetic field 12 mT, carbon-13 and protons precess at 128 and 510 kHz, respectively. At this field strength, the disclosed systems and methods may result in generated magnetic fields with phase phi and phi+90 degrees for traditional transfer. Other phase relationships can be generated for use in different applications. The specific waveform can accept frequency carriers across and outside this span, but will generate independent phase relationships of the nuclei at the respective frequencies. This solves the problem of using multiple transmitters to facilitate transfer and enables the use of simple hardware setups.

A typical block pulse may include a 90 degree pulse with a duration of 25 µs. A block pulse of this type may have a period of 100 µs, corresponding to a cycle time of 10 kHz. If that 90 degree pulse is applied at resonance, spins can be excited with approximately 50% efficiency at +/−5 kHz (the full width at half maximum). Unexpectedly, it has been found that PANORAMIC pulses can efficiently excite and refocus magnetic moments with high efficiency at offsets of ±191 kHz from the carrier using phase and amplitude modulated waveforms with 1500 separate pulses constrained to a maximum applied field of 4.2 kHz (100 µT). In some embodiments, offsets greater than ±191 kHz can be used. In some embodiments, it has been found that PANORAMIC pulses may be highly efficient when compared to typical block pulses.

When excitation pulses are combined with refocusing and inversion pulses, certain waveforms can enable heteronuclear spectroscopy with standard low-field NMR equipment (i.e., a system that lacks multinuclear hardware), and therefore may facilitate the construction of more portable and less expensive parahydrogen polarizers.

In one aspect, provided herein are a system and method for producing waveforms for multinuclear irradiation at low magnetic field strength with a single, phase- and amplitude-modulated transmitter channel. Because the pulses utilize a central frequency to rotate multinuclear magnetization on either side of the carrier, these pulses are referred to herein as precession and nutation for observing rotation at multiple intervals about the carrier ("PANORAMIC") pulses or waveforms. The PANORAMIC waveforms are well-suited to low-field NMR where multinuclear resonances are not prohibitively far apart, and can be tailored for simultaneous, phase-specific rotations using optimal control algorithms. In other embodiments, PANORAMIC waveforms can be tailored for simultaneous, phase-specific rotations using, for example, optimal control algorithms in conjunction with Bloch equations or density matrix simulations. In some embodiments, the PANORAMIC waveforms can be extended from excitation about canonical axes to variable angle, multinuclear rotations about independent, arbitrary axes at single or multiple offsets surrounding the carrier. In some embodiments, the transmitter channel is a phase and amplitude-modulated transmitter channel. In some embodiments, the transmitter channel is a frequency and amplitude-modulated transmitter channel.

In another aspect, provided herein are a system and method for enabling polarization storage on low gyromagnetic nuclei immediately after parahydrogenation, using a single channel to move magnetization from short-lived hydrogens to "X-nuclei", where "X-nuclei" can include any nucleus with j-coupling (i.e., magnetic field coupling mediated by the molecular backbone) to the added hydrogens.

A system and method for transferring magnetization from nascent to long-lived nuclei in parahydrogen-based hyperpolarization are also provided.

Schematic of a PANORAMIC NMR Spectrometer and Methods of Operation

Referring to FIG. 1, the major components of a PANORAMIC NMR Spectrometer system 2 include PANORAMIC waveforms 4 transmitted to a pulse programmer 6, which may also be referred to as an NMR console, which is interfaced to a computer 8. The pulse programmer 6 executes a set of instructions (i.e., a pulse program) and generates a precisely-timed radiofrequency and transistor-transistor logic ("TTL") pulses that control the degrees of freedom of the NMR system, including additional equipment that can be triggered with TTL signals, such as those required in parahydrogen induced polarization. In a standard low-field imaging system 2, the pulse programmer 6 sends a set of digital instructions to a transceiver module 10 which includes the hardware required for producing analog signals at a given frequency on a given channel. These signals can be characterized by amplitude, frequency, and phase and either phase or frequency and amplitude can commonly be modulated. Known spectrometers with multinuclear capabilities have multiple signal generators, with each channel generating a signal that has a well-defined phase relationship to the other channels. These phase-coherent channels each require a separate amplifier to account for different rotations (as required by the pulse sequence of interest) and the differential response of the RF circuitry (probe circuit and transmit-receive ("T/R") switch) at each frequency. The added complexity of these components in a multinuclear spectrometer increases system expense, in proportion with the additional circuitry required.

PANORAMIC accomplishes this multinuclear capability by amplitude and phase modulation on a single transmitter channel 12 to produce efficient rotations at multinuclear frequencies. Whereas a single block-pulse rotation of 90 degrees with 25 µs duration has a full-width at half the maximum bandwidth of 10 kHz, PANORAMIC pulses can produce efficient rotations with a frequency separation of 382 kHz (proton and carbon-13 separation of Larmor frequencies at a field strength of 12 mT). The PANORAMIC design process accommodates generating arbitrary phase relationships at multiple frequencies with a single channel. In hardware where frequency modulation is available, but not phase modulation, waveforms can be translated to frequency modulated waveforms by integrating the derivative of the phase waveforms with respect to time. With a single channel (frequency switchable), the off-resonant (multinuclear) spin experiences a large offset to effectively dephase magnetization. With PANORAMIC, magnetization in the rotating frame at each frequency appears approximately static, as if two rotating frames (two channels) were being applied. Thus, PANORAMIC produces stable, user-defined rotations at arbitrary frequencies and phases (in one embodiment up to 382 kHz separation with central carrier).

These waveforms can be transmitted through a single amplifier 14. As noted, multinuclear, multichannel devices require an amplifier for each band of interest. An additional advantage of PANORAMIC is that when NMR signals from multiple nuclei are desired simultaneously, PANORAMIC waveforms can be designed to make efficient use of the receiver bandwidth (e.g., placing the center of the field of view in the arithmetic, geometric, etc. mean). This may be a particular advantage for low field studies of parahydrogen induced polarization, because the polarization of protons is in continuous exchange with the coupled nuclei, and the flow of polarization provides an indication of the physical and chemical attributes of the hydrogenation and molecules under investigation.

In one embodiment of a PANORAMIC spectrometer 2, transmission and reception at multinuclei frequencies is accomplished with a broadband T/R switch 16 which can cover both frequencies. At a static magnetic field 18 of 12 mT, for example, carbon and protons precess at Larmor frequencies of 128 and 510 kHz, respectively, and the T/R switch 16 is capable of transmitting and receiving signals over the range from 100 kHz to 600 kHz. In addition to the broadband T/R switch 16, a double-resonant probe circuit 20 that takes a single input can be used. This coil 20 design can take multiple inputs and produce more than two outputs (i.e., resonant responses), and PANORAMIC waveforms can be used to multiplex one or more of the channels. In the double-tuned (carbon-13, proton) coil 20 shown in this embodiment, after the waveforms are transmitted to the single input, double resonant coil 20 tuned to 128 and 510 kHz, the time-dependent response of protons and carbon-13 induces a current in the receiver 22 by differentiating the low voltage signals returning from the large applied fields, with conventional NMR transmit/receive circuitry (i.e., T/R switch 16). Once received by the receiver 22, the signal can be provided to the transceiver 10. The transceiver 10 converts the analog signals into digital waves (i.e., digitizes the signal). The digital waves can be analyzed or viewed with the attached computer 8.

Figure 2:
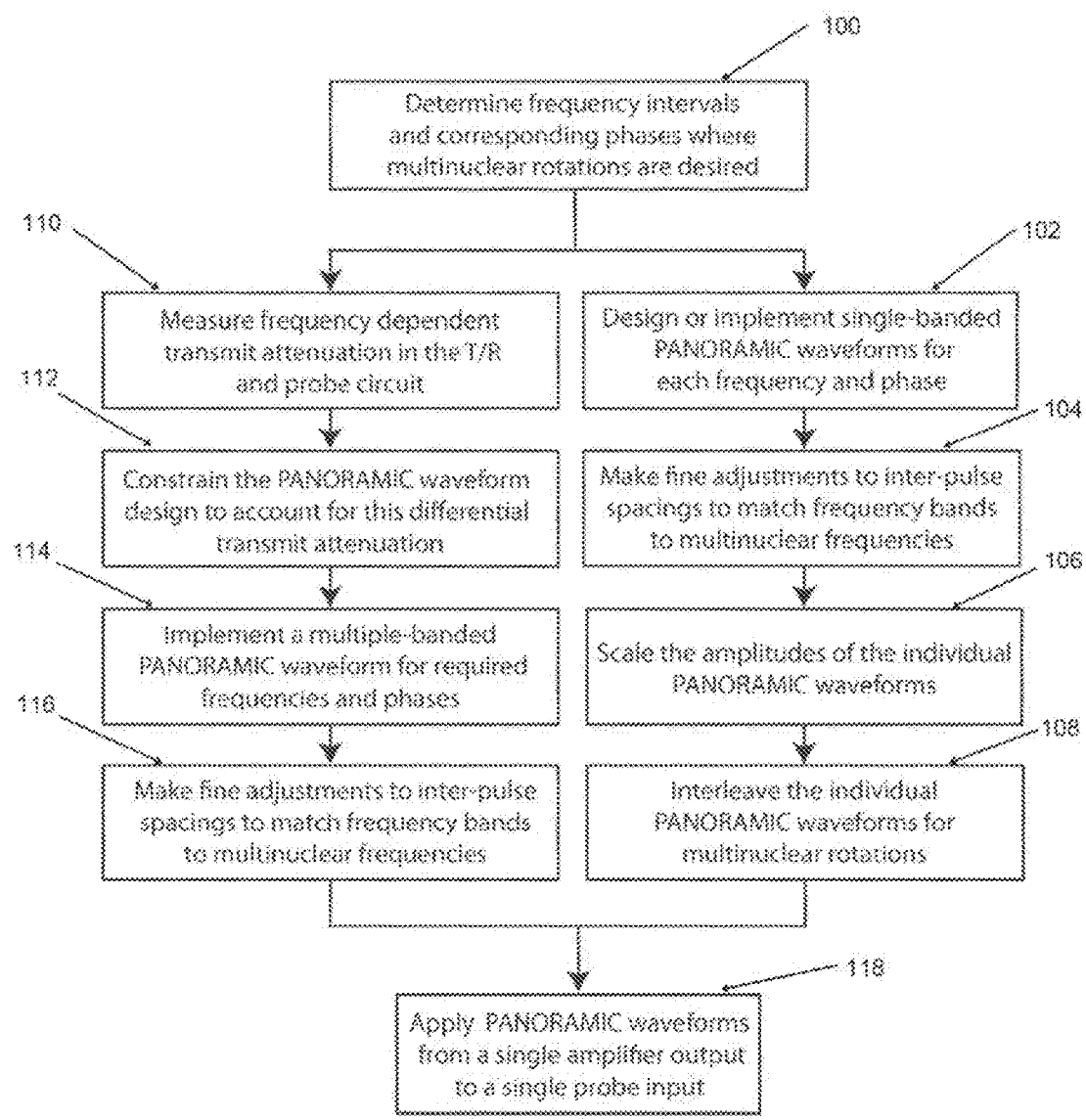
FIG. 2 is a flowchart illustrating techniques for nuclear magnetic resonance ("NMR") spectroscopy in accordance with an embodiment of the present disclosure.

FIG. 2 is a flowchart illustrating techniques for NMR spectroscopy in accordance with an embodiment of the present disclosure. Referring to FIG. 2, frequency intervals and corresponding phases (where spin-rotations are required) are determined at step 100. Single-banded PANORAMIC waveforms for each frequency and phase are designed (as described below) or implemented at step 102. Alternatively, frequency-dependent transmit attenuation in the T/R and probe circuit are measured at step 110, the PANORAMIC waveform design (described below) is constrained to account for the differential transmit attenuation at step 112, and multiple-banded PANORAMIC waveforms for required frequencies and phases are implemented at step 114. Fine-adjustments to the inter-pulse spacing of the PANORAMIC arrays to match the frequency bands to multinuclear frequencies are made at step 104 or 116. Increasing the pulse spacing decreases the frequency offsets. Decreasing inter-pulse spacing increases the frequency offsets. The amplitudes of the individual PANORAMIC waveforms are scaled to generate the desired rotation angle at step 106. Alternatively, the amplitudes are held constant and the probe efficiency at each band is adjusted. The individual PANORAMIC waveforms are interleaved for multinuclear rotations at step 108. This creates independent three-dimensional rotations at the given intervals. For a multiple resonant, multiple pulse experiment, the PANORAMIC waveforms are applied from a single amplifier output to a single probe input at step 118. This step is carried out in place of the rotations which are specified on independent channels in arbitrarily complex pulses sequences. In some embodiments, two channels may be multiplexed with PANORAMIC waveforms. In some embodiments, more than two channels may be multiplexed with PANORAMIC waveforms.

In some embodiments, PANORAMIC waveforms can be used in conjunction with other NMR spectroscopy processes. For example, in one embodiment, PANORAMIC waveforms are used to transfer hyperpolarization from a sample in an NMR apparatus, whereupon the resulting data are collected, processed, stored, and/or displayed in accordance with techniques known to those skilled in the relevant arts. In another embodiment, PANORAMIC waveforms are used to transfer hyperpolarization of a sample, whereupon the hyperpolarized sample is infused in vivo for an independent NMR spectroscopy or imaging scan in accordance with techniques known to those skilled in the relevant arts.

In some embodiments, PANORAMIC pulses are used to image diffusion in porous structures or to selectively excite bands of nuclear spins that are experiencing different static fields. The differences in the static fields of arbitrary samples can be induced by applying gradients or from the heterogeneous interaction of the sample with the magnetic field. Bands of nuclear spin precession are sampled by varying the inter-pulse spacing of PANORAMIC waveforms in multidimensional acquisitions which can allow for the rotation of tailored bands of resonance frequencies at large and variable offsets.

The coupling between nuclei and electric field gradients in quadrupolar nuclei (e.g. nitrogen-14, oxygen-17) gives rise to broad magnetic resonance spectra that can pose challenges for uniform excitation. The spectra of the nuclei can span several MHz, and at these offsets, the use of short block-shaped pulses may lead to significant frequency-dependent rotations. To increase sensitivity of these nuclei, the samples can be rotated at high angular velocity (several kHz) and the resultant spectra display several distinct bands, which are referred to as spinning sidebands. In some embodiments, PANORAMIC waveforms are used to efficiently rotate these bands, either uniformly or with tailored phase differences. When phase differences are applied, a range of additional polarization transfer mechanisms are available. PANORAMIC pulses may also be used with a variable increment to identify the spectral sidebands, and the waveforms can be designed to coincide with sample spinning with one or more rotations.

In some embodiments, PANORAMIC waveforms can be used to transfer polarization between combinations of nuclear spins using single a single channel. In some embodiments, PANORAMIC waveforms can be used to transfer polarization between combinations of nuclear spins using multiple channels. Transfer between carbon-13 and protons can be accomplished using a single channel with PANORAMIC waveforms, and can be used in conjunction with parahydrogen induced polarization. Proton magnetization can also be transferred to nitrogen, phosphorous, or silicon, and combinations thereof. PANORAMIC waveforms are not limited to transferring between pairs of nuclei, and in some embodiments are used to move nuclear polarization in more extensive networks. A network of coupled nuclear spins can be accessed, i.e., the methods disclosed are not limited to the sets of biologically relevant systems containing combinations of nitrogen-15, carbon-13, phosphorous-31, fluorine-19, nitrogen-14, oxygen-17, and silicon-29. In some embodiments, PANORAMIC waveforms can replace polarization transfer sequences applied on two or more channels to single waveforms applied to one channel, or combinations of PANORAMIC waveforms on a first channel and a second channel, or combinations of channels multiplexed with PANORAMIC waveforms and single channels.

Quantum computers based on nuclear spins can create entangled states by preparing spin-states with pulsed radiofrequency transformations in coupled networks. In some embodiments, PANORAMIC are used to prepare these spin-states in systems with several Larmor precession frequencies, or with coupled spins at large offsets, and can allow for the reduction in the number of channels required for preparation and/or for the capability to access large offsets with tailored rotations.

EXAMPLES

The following Examples are illustrative, but not limiting of the devices and methods of the present disclosure. Other suitable modifications and adaptations of a variety of conditions, parameters, and components are within the spirit and scope of this disclosure.

Example 1

PANORAMIC Waveforms for Heteronuclear NMR Spectroscopy with a Single Transmitter Channel Pulse Design:

An optimal control algorithm running on a personal computer was used to design PANORAMIC waveforms. In particular, the output of the personal computer includes phase and amplitude-modulated tables as arrays. Amplitudes were seeded randomly, and phases were iteratively adjusted by determining differences in the physical paths associated with 1) the forward RF-induced propagation of the magnetization $M^F(t)$ from the given initial conditions $M_0$, and 2) the propagation of the magnetization $M^R(t)$ due to the time-reversed RF waveform starting with the target magnetization state $M^{target}$. The difference in these two spatial trajectories, $\Delta\omega(t)$, is given by the cross product of the magnetization vector at each time point in the composite RF waveform:

$$\Delta\omega(t) = M^F(t) \times M^R(t). \tag{1}$$

The composite pulse for the next computational iteration was determined according to:

$$\Delta\tilde{A}(t) = \lambda |\Delta\omega(t)|, \tag{2}$$

with $\tilde{A}(t)$ representing the complex amplitude, physical amplitude represented by $$A(t) = \Re \, \epsilon(\Delta\overline{A}(t)),$$

and the phase represented by $$\Delta\varphi(t) = xm(\Delta\overline{A}(t)).$$

The parameter, $\lambda$, was determined by a secondary least-squares minimization procedure such that improvement in the cost function was maximized for the given iteration. Analytic solutions of magnetization trajectories, $M^F(t)$ and $M^R(t)$, were calculated from a relaxation-free form of the Bloch equations (Bendall et al., "Theoretical description of depth pulse sequences, on and off resonance, including improvements and extensions thereof," *Magn Reson Med* 1985; 2(2):91-113).

An example cost function for a 180 degree rotation specifically designed for dual-banded refocusing is given by:

$$\delta(A) = \frac{\kappa}{m} \sum_{i=1}^{m} (1 - M_i^F(t) \cdot M_i^{target}) + \frac{(1-\kappa)}{n} \sum_{j=1}^{n} (1 - M_j^F(t) \cdot M_j^{target}), \tag{3}$$

where i and j indicate the step number through the lower and upper frequency bands, respectively. In these targeted frequency bands, the scalar product between the final magnetization state for a given set of complex amplitudes (as determined from the Bloch equations) and the target end-magnetization state specified by the user serves as a metric of pulse performance. The parameter, $\kappa$, acts as a Lagrange multiplier in weighting the importance of the two specified frequency bands.

The carrier frequency for the design of PANORAMIC pulses is most efficient when placed central to the bands of interest. For carbon-13 and protons, the resonant frequencies at 12 mT are 510.91 kHz and 128.46 kHz, respectively, and therefore the carrier frequency is most efficient when placed at 319 kHz. The corresponding resonant offsets from the carrier are +/−191.22 kHz. The target excitation bandwidth was constrained at 2 kHz to encompass field inhomogeneities in the electromagnet, but results suggest that larger bandwidths are accessible. In the test case of a 180 degree refocusing pulse, 3000 free parameters (1500 phases and amplitudes) were optimized at 2.1 µs dwell times, for a pulse duration of 3150 µs. RF amplitude was limited to 100 µT and enforced during the optimization according to established methods (Skinner et al., "Reducing the duration of broadband excitation pulses using optimal control with limited RF amplitude," *J Magn Reson* 2004; 167(1):68-74). Increasing the switching time between amplitudes above 2.1 µs will cause the frequency bands to contract towards the carrier and vice versa and offer a practical method for making fine adjustments to the precise placement of the frequency bands. Reducing pulse bandwidth reduces the number of free parameters required for uniform rotation across the frequency band.

Procedure:

Data were acquired at 12 mT using a portable, low-field spectrometer and broadband transmit/receive switch spanning approximately 100 to 600 kHz (Magritek, NZ). The static field was generated with a four-layer, 22", custom solenoidal electromagnet, maintained with a PM2813 programmable power supply (Philips, The Netherlands). RF spectrometer outputs were amplified using a BT00250-AlphaA pulsed RF amplifier (Tomco, Australia) and routed to a custom, single input, double-tuned circuit (128 and 510 kHz) with paired saddle coils, assembled as described below.

Double Tuned $^1H/^{13}C$ Coil for Heteronuclear Spectroscopy at Low Field (12 mT) with a Single Transmitter Presented is a circuit designed for optimal tuning and matching at both frequencies on the same input channel. The pole-insertion method was used for matching circuitry to match the probe input channel to spectrometer input impedance on both frequencies. The circuit uses a single, homogeneous saddle coil antenna and enables single-shot detection at 12 mT from 30 mL with an SNR of 5.

Methods:

A saddle coil pair was wound with 20 AWG enamel coated copper wire (EIS/Fay Electric Wire, Atlanta, Ga.) about an arc length of 120° and coil length of 5.5 inches, on an acrylic former tube with 3 inch OD and 2.5 inch ID. Inductance was estimated at 214 µH using a model E5071C network analyzer (Agilent Technologies, Santa Clara, Calif.). Circuit component values were then calculated with MATLAB® scripts (MathWorks, Inc., Natick, Mass.). When placed inside the magnet bore, a shift in coil and air-core inductance (trap circuits) was observed with a concomitant shift in resonant frequencies. The coil was retuned inside the bore, and the resulting attention of reflected signal (losses) relative to input signals was estimated to be greater than 25 dB.

Data were acquired at 12 mT with a model KEA portable spectrometer (Magritek, New Zealand) outfitted with a broadband (100-600 kHz) T/R switch and Model Alpha low frequency pulsed amplifier (Tomco, Australia). The static field was generated with a custom solenoid electromagnet. This magnet was 22" in length, and 4 layers were wound on a 2.5" bobbin with 15 mil Nymex insulation between layers. A programmable power supply (Fluke PM2813, Holland, Netherlands) operating at 10 V and approximately 5 amps was sufficient to create a 12 mT magnetic field. Free induction decays of spin-echoes were sampled at 2 µs with TE=8 ms and TR=350 µs on an aqueous solution of copper sulfate 90 (30 mL).

Figure 3:
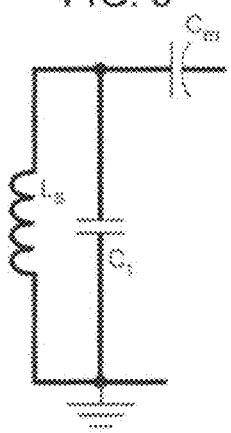
FIG. 3 is a schematic diagram for a single-tuned coil.
Figure 4:
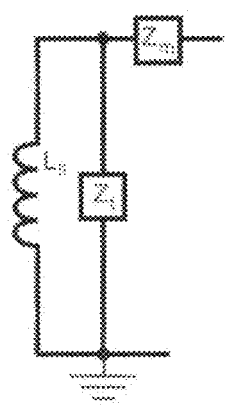
FIG. 4 is a schematic diagram for converting a single-tuned coil into single-input, dual-tuned coil by replacing tuning cap $C_T$ with a complex impedance network, $Z_T$, and matching capacitor, $C_M$, with complex impedance network $Z_M$.
Figure 5:
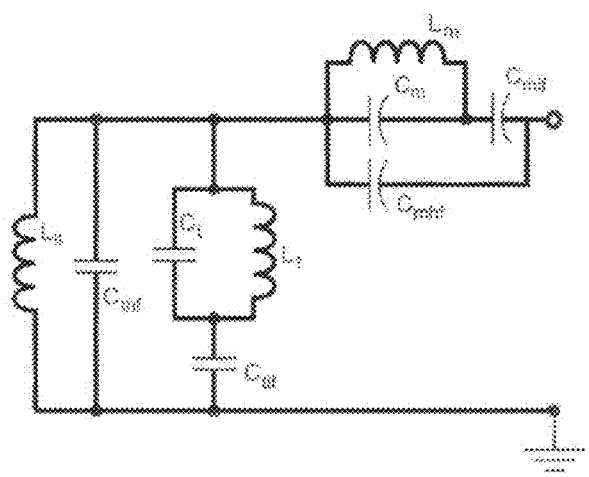
FIG. 5 is a schematic representation of a single-input, double-tuned circuit used to transmit PANORAMIC waveforms.
Figure 6:
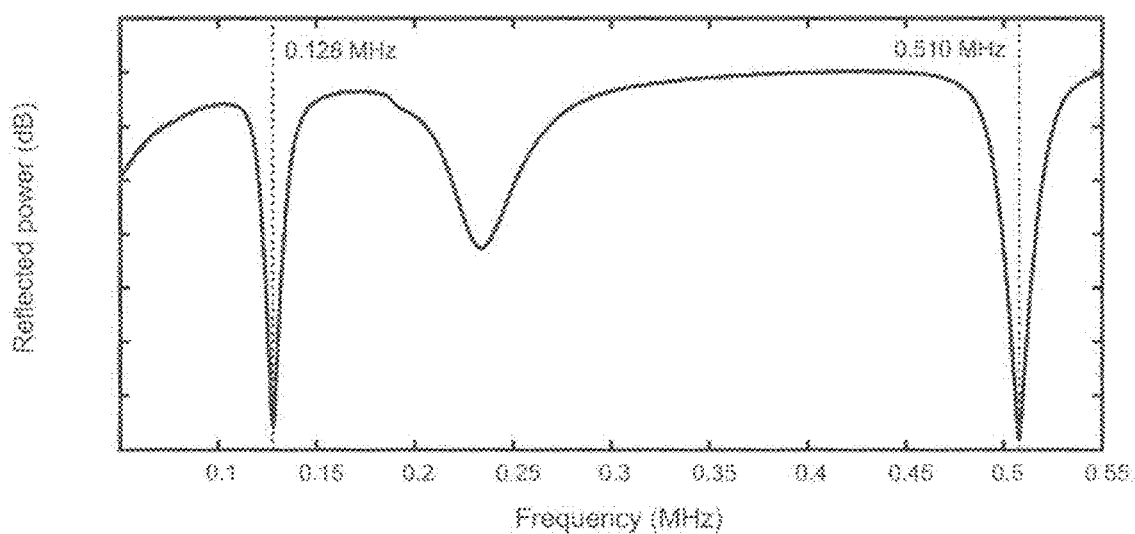
FIG. 6 is a graph showing frequency-dependent attenuation of single input coil tuned to 0.510 and 0.128 kHz.

A schematic diagram for the single-tuned coil is shown in FIG. 3. A given probe with inductance $L_S$ can be tuned to the required frequency with the parallel capacitor $C_T$. The resonating probe can be matched to spectrometer impedance using the matching capacitor $C_M$. This single-tuned coil can then be converted into a single-input, dual-tuned coil by replacing the tuning cap, $C_T$, and matching capacitor, $C_M$, with a complex impedance network, $Z_T$, and a complex impedance network $Z_M$, respectively, as shown in FIG. 4. Complex impedance networks, $Z_T$ and $Z_M$, are designed such that at low frequency their values are $C_{Tlf}$ and $C_{Mlf}$ and at high frequency they are $C_{Thf}$ and $C_{Mhf}$. One such implementation is shown in FIG. 5. FIG. 6 is a graph showing frequency-dependent attenuation of the single input coil tuned to 0.510 and 0.128 kHz. The transmission at the resonant modes (0.510, 0.128 MHz) was greater than 97%.

Figure 7:
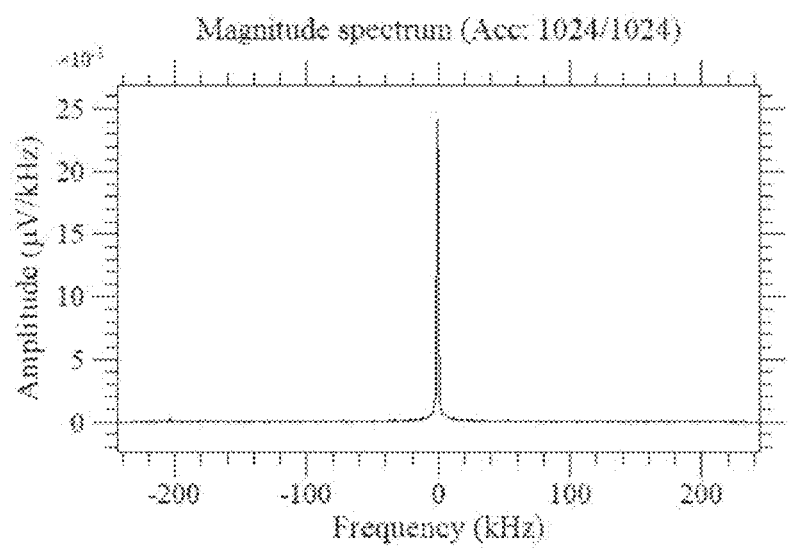
FIG. 7 shows spin-echo spectra with block pulse excitation and block pulse refocusing (TOP) versus block pulse excitation and PANORAMIC refocusing (BOTTOM).
Figure 7:
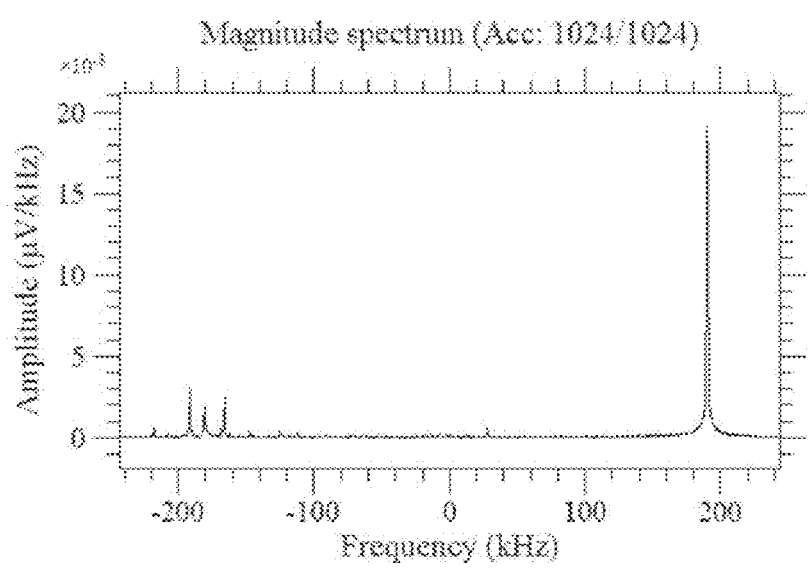

PANORAMIC pulse efficiency was measured by comparing the signal amplitude acquired from spin-echo sequences. Block-pulse excitations with block-pulse refocusing were compared with block-pulse excitation and PANORAMIC refocusing. FIG. 7 shows spectra comparing block pulse excitation and block pulse refocusing (TOP) in a spin-echo experiment versus block pulse excitation and PANORAMIC refocusing (BOTTOM). Whereas block excitation without a refocusing pulse yielded no signal, PANORAMIC refocusing (with block-pulse excitation) recovered 100% of the magnetization acquired from block-pulse refocusing (with block-pulse excitation). Excitation block-pulses were 150 µs in duration and refocused with 250 µs block-pulses. The PANORAMIC waveform was characterized by 1500 phases and amplitudes, with the switching time between events set to 2.1 µs, for a pulse duration of 3150 µs. Received analog signals were digitized with a dwell time of 2 µs, and 1024 transients were signal-averaged from a 30 mL aqueous $CuSO_4$ solution using a recycle delay of 350 ms.

Results:

Waveforms for rotating $^{13}C$ and $^1H$ magnetization from a single, central carrier frequency were designed with optimal control and tested at 12 mT. PANORAMIC waveforms were developed for refocusing (180 degree rotation of transverse magnetization) and for generating +y and +x-axis magnetization at a 2 kHz band centered on carbon-13, with matched extension to proton frequencies starting from z-magnetization. Magnetization in the untargeted band was minimally disturbed without additional constraints in the design algorithm.

PANORAMIC efficiency was measured relative to conventional pulses by replacing block pulses in spin-echo sequences. Excitation with these phase and amplitude modulated arrays followed by block pulse refocusing yielded a signal integral within experimental error to the block pulse replacement experiment. PANORAMIC pulses gave amplitudes that were smaller and excitation bandwidths that were larger, yielding integrals within experimental error. Block pulses were much shorter than PANORAMIC pulses (250 µs versus 3150 µs), hence used higher power at an apparent decrease in effective bandwidth relative to single side-bands.

Discussion:

Waveforms were designed and tested for performing multinuclear NMR spectroscopy with a single transmitter channel. These phase and amplitude modulated pulses utilize a central frequency for observing a wide field of view, analogous to wide-angle photography, and therefore are referred to as PANORAMIC (Precession And Nutation for Observing Rotation At Multiple Intervals about the Carrier) waveforms. Waveforms presented herein were designed for single- and dual-band excitation and refocusing. Parahydrogen hyperpolarization is driving the emergence of multiple-resonance, low-field NMR. When excitation pulses are combined with refocusing and inversion pulses, PANORAMIC waveforms can enable multinuclear spectroscopy with standard low-field NMR equipment that is not equipped with multinuclear capabilities, and therefore may facilitate the construction of more portable and less expensive parahydrogen polarizers.

Phases and amplitude modulation tailored with optimal control was used to build these waveforms, and initial designs used 1500 steps at a 2.1 µs dwell time for total pulse durations of 3150 µs. The extended length of these initial PANORAMIC waveforms is not an inherent design necessity. Further studies will assess efficiency and bandwidth as a function of phase and amplitude table size, to identify possible trade-offs in performance with shorter pulses. The approximately 3 ms pulse durations used are easily accommodated in the anticipated application to polarization transfer in portable NMR hyperpolarization devices. Pulse sequences for transferring polarization are on the order of 30-100 ms and require 10 or fewer pulses, so even if relatively long PANORAMIC pulses are used, any $^{13}C$ to $^1H$ transfer may be accessible. These pulses are not limited to transfer between $^1H$ and $^{13}C$ and may span any pair of nuclei. Frequency bands spanning 382 kHz were demonstrated above, corresponding to the separation of $^{13}C$ and $^1H$ at a static field of 12 mT, but the upper limits of the attainable frequency separation have not been fully explored. The maximum accessible range is larger than 382 kHz, but overall it is anticipated that these pulses may find application in relatively low field (<50 mT) applications.

Example 2

Use of PANORAMIC for Transferring Parahydrogen Polarization

Parahydrogen Generation:

Approximately 98% parahydrogen gas is prepared with a custom, pulsed-flow generator as described in U.S. Patent Application 61/478,193. Briefly, research grade orthohydrogen gas is passed through a low temperature (<20 K) chamber filled with iron-oxide catalyst. Using scaffolds with helically distributed ports, flow through the iron-oxide catalyst chamber is restricted to increase surface contact between hydrogen and catalyst and thereby increase the conversion efficiency between ortho and parahydrogen. Para-enriched hydrogen gas is collected in a 10 L aluminum storage tank at 200 psi. The percentage of conversion is verified by $^1H$ spectroscopy at 500 MHz with a high resolution NMR spectrometer (Bruker Biospin, Germany).

Molecular addition of parahydrogen: The addition of parahydrogen gas to the unsaturated, carbon-13 labeled test compound is carried out in a custom polarizer, as described in U.S. Patent Application 61/478,193. The catalyst is prepared in distilled water using reported procedures to a final catalyst concentration of 2.5-3.0 mM. For this test demonstration of polarization transfer with PANORAMIC, 2-hydroxyethyl-1-$^{13}C$-acrylate-$d_{2,3,3}$ ("HEA"), (product number 676071, Sigma-Aldrich-Isotec, Miamisburg, Ohio) is used, due to commercial availability and literature precedent for adding parahydrogen to the molecule and transferring the polarization to an adjacent carbon atom. This molecule is added to the aqueous catalyst solution to a final HEA concentration of 9 mM. This solution of HEA and catalyst will then be reacted with the previously prepared parahydrogen gas, using a custom polarizer, as described in U.S. Patent Application 61/478,193. The reactor pressure after spraying the liquid using high pressure $N_2$ gas into an atmosphere of para-$H_2$ gas is empirically optimized to a value between 120 to 250 psi. The reactor chamber of the polarizer device is injected with the aqueous mixture of molecular precursor, catalyst in the presence of parahydrogen. During the chemical reaction, continuous wave decoupling is applied to protons, and multinuclear polarization transfer will commence at an empirically optimized delay. The continuous wave decoupling is applied at the proton frequency of 510 kHz (12 mT static magnetic field) and switched to the center of protons and carbon-13 afterwards and just prior to the beginning of polarization transfer. Since transverse magnetization is not created during the decoupling period, extra precautions to align magnetization in the rotating frame should be unnecessary following the frequency switch. All of these events are controlled with a central, pulse-programmable, spectrometer-based controller (KEA, Magritek, New Zealand).

Polarization Transfer from Parahydrogen:

Parahydrogen polarization is transferred to carbon-13 in the saturated HEA molecule using a previously reported pulse sequence (Goldman et al., *Physique* 2005, 6, 575-581). This pulse sequence requires radiofrequency transformations of spin-magnetization at two frequencies (protons and carbon for this molecule, proton and X-nucleus in the most typical, general implementation). On the proton channel, there is one 180 degree rotation and on the carbon channel (channel of coupled spin in general), there are two 90 degree rotations which are phase-shifted (one x-phase and one y-phase). There are three time intervals where radiofrequency pulses are not applied and spins precess about the static field at the respective Larmor frequencies. Additional 180 degree pulses on both channels are used to refocus offsets that arise from either chemical shifts or inhomogeneities in the static field.

This pulse sequence has been shown to transfer polarization from protons to carbon-13 in hyperpolarized molecules (Goldman et al., *Physique* 2005, 6, 575-581). To test the ability of PANORAMIC pulses to accomplish this transfer using only a single-channel, these two channels are replaced with a single set of PANORAMIC waveforms. Where 180 degree rotations are required simultaneously, dual-banded PANORAMIC waveforms will be used. Where only a single 90 or 180 degree rotation is required, a single-banded PANORAMIC pulse is used. This amounts to matching each transformation in the double channel polarization sequence with a single-channel, PANORAMIC analogs. This is a transparent mapping of double-channel rotations to single-channel PANORAMIC rotations, and given the 12 mT test field, it is anticipated that the single transmit frequency will be located centrally between protons and carbon at 319 kHz.

What is claimed is:

1. An NMR imaging system comprising:
   a transceiver module configured to couple with a magnetic resonance transmitter coil, wherein the transceiver module includes a first transmitter channel; and
   a pulse programmer configured to control the transceiver module, the transceiver module generating a PANORAMIC waveform, the PANORAMIC waveform configured to produce nuclear polarization;
   wherein the magnetic resonance transmitter coil is a double-tuned proton/carbon-13 coil.

2. The NMR imaging system of claim 1, wherein the transmitter channel is a phase and amplitude-modulated transmitter channel.

3. The NMR imaging system of claim 1, wherein the PANORAMIC waveform is a single-banded PANORAMIC waveform.

4. The NMR imaging system of claim 1, wherein the PANORAMIC waveform is a multiple-banded PANORAMIC waveform.

5. The NMR imaging system of claim 1, wherein the PANORAMIC waveform is applied from a single amplifier output to a single probe input.

6. The NMR imaging system of claim 1, wherein the magnetic resonance transmitter coil is configured to accept multiple frequency inputs and produce more than two resonant responses and wherein the PANORAMIC waveform multiplexes at least one of the resonant responses.

7. The NMR imaging system of claim 1, wherein the transceiver module further includes a second transmitter channel.

8. A method of NMR spectroscopy or imaging, the method comprising:
   determining for a nuclear spin rotation at least one frequency interval and at least one corresponding phase;
   creating a PANORAMIC waveform for the at least one frequency interval and the at least one corresponding phase; and
   applying the PANORAMIC waveform from an amplifier output to a probe input and
   interleaving the PANORAMIC waveforms.

9. The method of claim 8, wherein the PANORAMIC waveform is a single-banded PANORAMIC waveform.

10. The method of claim 8, wherein the PANORAMIC waveform is a multiple-banded PANORAMIC waveform.

11. The method of claim 8, further comprising the step of making adjustments to inter-pulse spacings to match the frequency bands to multinuclear frequencies.

12. The method of claim 8, further comprising the step of scaling the amplitudes of the PANORAMIC waveforms.

13. The method of claim 8, wherein the NMR spectroscopy or imaging takes place using a static magnetic field of 10 mT to 15 mT.

14. A method of NMR spectroscopy or imaging, the method comprising:
   determining for a nuclear spin rotation at least one frequency interval and at least one corresponding phase;
   creating a PANORAMIC waveform for the at least one frequency interval and the at least one corresponding phase; and
   applying the PANORAMIC waveform from an amplifier output to a probe input;
   wherein the NMR spectroscopy or imaging takes place using a static magnetic field of 10 mT to 15 mT.

15. The method of claim 14, wherein the PANORAMIC waveform is a single-banded PANORAMIC waveform.

16. The method of claim 14, wherein the PANORAMIC waveform is a multiple-banded PANORAMIC waveform.

17. The method of claim 14, further comprising the step of making adjustments to inter-pulse spacings to match the frequency bands to multinuclear frequencies.

18. The method of claim 14, further comprising the step of scaling the amplitudes of the PANORAMIC waveforms.

\* \* \* \* \*

UNITED STATES PATENT AND TRADEMARK OFFICE
CERTIFICATE OF CORRECTION

PATENT NO. : 9,581,668 B2
APPLICATION NO. : 14/125418
DATED : February 28, 2017
INVENTOR(S) : Kevin W. Waddell et al.

Page 1 of 1

It is certified that error appears in the above-identified patent and that said Letters Patent is hereby corrected as shown below:

In the Specification

Column 1, Line 18:
Replace the following paragraph: [[This invention was made with government support from a National Institutes of Health and National Cancer Institutes grant 5P50 CA128323-02. The government has certain rights in the invention.]]

With the paragraph: --This invention was made with government support under grant number CA128323 awarded by the National Institutes of Health. The government has certain rights in the invention.--

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*